(12) United States Patent
Ghosh et al.

(10) Patent No.: US 11,349,458 B1
(45) Date of Patent: May 31, 2022

(54) TRANSISTOR AGING MONITOR CIRCUIT FOR INCREASED STRESS-BASED AGING COMPENSATION PRECISION, AND RELATED METHODS

(71) Applicant: Microsoft Technology Licensing, LLC, Redmond, WA (US)

(72) Inventors: Amlan Ghosh, Mebane, NC (US); Joshua Puckett, Raleigh, NC (US); Isaac Turtletaub, Charlotte, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/481,603

(22) Filed: Sep. 22, 2021

(51) Int. Cl.
*H03K 3/03* (2006.01)
*G01R 31/26* (2020.01)
*H03K 3/011* (2006.01)
*H03K 3/354* (2006.01)
*G01R 31/28* (2006.01)

(52) U.S. Cl.
CPC ....... *H03K 3/0315* (2013.01); *G01R 31/2642* (2013.01); *G01R 31/2817* (2013.01); *H03K 3/011* (2013.01); *H03K 3/354* (2013.01)

(58) Field of Classification Search
CPC ...... H03K 3/354; H03K 3/0315; H03K 3/011; G01R 31/2642; G01R 31/2817
USPC .......... 331/176, 57; 324/769; 326/83, 68, 81
See application file for complete search history.

(56) References Cited

U.S. PATENT DOCUMENTS

| | | | | |
|---|---|---|---|---|
| 8,138,791 B1* | 3/2012 | Ratnakumar | ....... | H01L 29/7848 326/45 |
| 9,467,143 B1* | 10/2016 | Puckett | ............ | H03K 19/00315 |
| 2009/0189703 A1* | 7/2009 | Chuang | ................ | H03K 3/0315 331/57 |
| 2013/0222071 A1* | 8/2013 | Chuang | .................. | G11C 29/50 331/57 |

OTHER PUBLICATIONS

Kim, T. et al., "Silicon Odometer: An On-Chip Reliability Monitor for Measuring Frequency Degradation of Digital Circuits," IEEE Journal of Solid-State Circuits, vol. 43, Issue 4, Apr. 2008, IEEE, pp. 874-880.

(Continued)

*Primary Examiner* — Arnold M Kinkead
(74) *Attorney, Agent, or Firm* — Withrow & Terranova, PLLC

(57) ABSTRACT

A stress-based aging monitor circuit includes a reference ring oscillator circuit and a stressed ring oscillator circuit that each include transistors like the transistors in a circuit to be monitored. Transistors in the stressed ring oscillator circuit receive a negative gate to source voltage bias while the reference ring oscillator is protected from stress. To measure performance degradation due to stress-based aging, the switching frequencies of the reference ring oscillator circuit and the stressed ring oscillator circuit are compared. The reference ring oscillator and the stressed ring oscillator include stress-enhanced inverter circuits configured to amplify stress-based aging effects to increase sensitivity to the performance degradation caused by stress-based aging. Increased sensitivity increases the precision (e.g., higher resolution) of a supply voltage guard band adjustment used to compensate for the performance degradation to reduce or avoid overcompensating for the effects of stress-based aging.

21 Claims, 8 Drawing Sheets

(56) References Cited

OTHER PUBLICATIONS

Reddy, V. et al., "Impact of Negative Bias Temperature Instability on Digital Circuit Reliability," Proceedings of the 40th Annual 2002 IEEE International Reliability Physics Symposium, Apr. 7-11, 2002, Dallas, Texas, USA, IEEE, pp. 248-254.

Saneyoshi, E. et al., "A Precise-Tracking NBTI-Degradation Monitor Independent of NBTI Recovery Effect," 2010 IEEE International Solid-State Circuits Conference (ISSCC 2010) Digest of Technical Papers, Feb. 9, 2010, IEEE, pp. 192-194.

* cited by examiner

TRANSISTOR AGING MONITOR CIRCUIT FOR INCREASED STRESS-BASED AGING COMPENSATION PRECISION, AND RELATED METHODS

FIELD OF THE DISCLOSURE

The technology of the disclosure relates in general to transistor performance degradation over time, and more specifically, to monitoring and compensating the effects of aging in metal-oxide-semiconductor (MOS) field-effect transistors (FETs) (MOSFETs).

BACKGROUND

Metal-oxide-semiconductor (MOS) field-effect transistors (FETs) (MOSFETs) are a type of transistor that is commonly employed in integrated circuits (ICs) for many different functions, including processor and control logic as well as memory circuits. Over time, phenomena such as bias temperature instability (BTI) and hot carrier injection (HCI) cause degradation in performance (stress-based aging) of MOSFETs. The impact of BTI and HCI is a function of the stress voltage and temperature and also depends on the duration and fraction of time the device is stressed. As MOSFETs become smaller with technology scaling, these effects can create serious device reliability issues. One result of MOSFET stress-based aging is an increase in threshold voltage, particularly in P-type MOSFETs (PFETS), which are more affected by these aging effects than N-type MOSFETs (NFETs). Increased threshold voltage increases the switching delay of a MOSFET, which causes circuit performance (i.e., frequency) to degrade over time. Fortunately, the stress-based aging effect at the end of life of an IC can be compensated for by adding a guard band to the supply voltage when a reduction in performance due to aging is detected. However, providing a supply voltage with a guard band increases dynamic power consumption.

Detecting frequency degradation in a complementary MOS (CMOS) logic gate-based ring oscillator has been identified as a low-cost yet reliable method to accurately monitor MOSFET aging. Some conventional implementations of a CMOS ring oscillator circuit have low sensing resolution (e.g., in a range of 5%-10% frequency degradation) and require highly accurate and expensive test hardware or a long measurement time, making it an invasive and intractable approach for run-time monitoring. In addition, the measurement results can be very sensitive to environmental variations such as temperature shifts, which make it difficult to determine what portion of the measured device performance degradation is due solely to BTI/HCI (stress-based aging). Since the resolution is very small, it may be harder to decouple the BTI/HCI effect from the effect of local variation and supply noise. In addition, in the conventional CMOS logic gate-based ring oscillator implementations, only the PMOS devices in every other stage of the ring oscillator circuits are in a stressed condition at a given time. In this regard, it can be difficult to accurately measure the effects of stress-based aging.

SUMMARY

Exemplary aspects disclosed herein include a transistor aging monitor circuit for increased stress-based aging compensation precision. Related methods of detecting stress-based aging and compensating stress-based aging in transistors are also disclosed. The stress-based aging monitor circuit is an integrated circuit (IC) that includes a reference ring oscillator circuit and a stressed ring oscillator circuit that each include transistors like or similar to the transistors in a circuit to be monitored. To approximate the stress applied to the monitored transistors, transistors in the stressed ring oscillator circuit receive a negative gate to source voltage bias while the supply voltage is provided to the aging monitor circuit and the supply voltage is provided to the aging monitor circuit when the supply voltage is provided to the monitored transistors. A reference ring oscillator, in which the transistors are a control group for purposes of comparison, is protected from stress by decoupling the reference ring oscillator from the supply voltage except during a monitoring mode. Then, the switching frequencies of the reference ring oscillator circuit and the stressed ring oscillator circuit are compared to detect transistor stress-based aging in the stressed ring oscillator circuit. Stress-based aging is indicated by a degradation in frequency of an oscillator signal generated by the stressed ring oscillator compared to a frequency of a second oscillator signal generated by the reference ring oscillator. In exemplary aspects herein, the reference ring oscillator and the stressed ring oscillator include stress-enhanced inverter circuits configured to amplify stress-based aging effects to increase sensitivity to the performance degradation caused by stress-based aging. Increased sensitivity increases the precision (e.g., higher resolution) of a supply voltage adjustment used to compensate for the performance degradation to reduce or avoid overcompensating for the effects of stress-based aging.

In some examples, the stress-enhanced inverter circuits include a first P-type field-effect transistor (FET) (PFET) coupled between an inverter input and a gate of a second PFET in an inverter to generate an inverter output in which the effects of stress-based aging are amplified. In some examples, when the supply voltage is provided to the stressed ring oscillator, at least one of the first PFET and the second PFET in each of the stress-enhanced inverter circuits is stressed by receiving a negative gate to source voltage bias. In some examples, the first PFET in every stress-enhanced inverter circuit in the stressed ring oscillator is stressed in every cycle as the stress-enhanced inverters oscillate between a first state and a second state. In other examples, the second PFET in every stress-enhanced inverter circuit in the stressed ring oscillator is stressed in a non-oscillating mode. The stress-based aging monitor circuit ensures stress-based aging in one of the first PFET and the second PFET and amplifies the effects of stress-based aging in the first PFET in the second PFET to increase detection sensitivity. Increased detection sensitivity increases the accuracy of stress-based aging detection, which makes it possible to more accurately apply a voltage guard band to the supply voltage to compensate for the stress-based aging performance degradation. Reducing or avoiding overcompensation of the stress-based aging improves dynamic power efficiency.

In exemplary aspects disclosed herein, a transistor aging monitor circuit is disclosed. The transistor aging monitor circuit comprises a stressed ring oscillator circuit comprising a first plurality of stress-enhanced inverter circuits coupled in a first series of stress-enhanced inverter circuits. Each of the first plurality of stress-enhanced inverter circuits comprises a first transistor configured to couple an input node to a first internal node in response to a bias signal; a second transistor configured to couple a supply voltage rail to an inverter output in response to a voltage state of the first internal node, and a third transistor configured to couple a ground voltage rail to the inverter output in response to a voltage state of a second internal node; wherein, in a first mode, one of the first plurality of stress-enhanced inverter circuits in the first series of stress-enhanced inverter circuits is configured to generate a first oscillator signal comprising a first frequency. The transistor aging monitor circuit comprises a reference ring oscillator circuit comprising a second plurality of stress-enhanced inverter circuits coupled in a second series of stress-enhanced inverter circuits, one of the second plurality of stress-enhanced inverter circuits configured to, in the first mode, generate a second oscillator signal comprising a second frequency. The transistor aging monitor circuit also comprises a comparator circuit configured to compare the first frequency to the second frequency and generate an indication of stress-based aging of transistors in a monitored circuit based on a difference between the first frequency and the second frequency.

In another exemplary aspect, a method of monitoring transistor aging in an integrated circuit is disclosed. The method comprises, in a first mode, generating, in a stressed ring oscillator circuit comprising a first plurality of stress-enhanced inverter circuits coupled in a first series, a first oscillator signal comprising a first frequency. Generating the first oscillator signal further comprises, in each of the first plurality of stress-enhanced inverter circuits: coupling, by a first transistor, an input node to a first internal node in response to a bias signal; coupling, by a second transistor, an inverter output to a supply voltage rail in response to a voltage state of the first internal node; and coupling, by a third transistor, the inverter output to a ground voltage rail in response to a voltage state of a second internal node; wherein, in a first mode, one of the first plurality of stress-enhanced inverter circuits in the first series of stress-enhanced inverter circuits is configured to generate a first oscillator signal comprising a first frequency. The method further comprises generating, in a reference ring oscillator circuit comprising a second plurality of stress-enhanced inverter circuits coupled in a second series of stress-enhanced inverter circuits, a second oscillator signal comprising a second frequency; comparing, in a comparator circuit, the first frequency to the second frequency; and generating an indication of a stress-based age of the stress-enhanced inverter circuits in the stressed ring oscillator based on a difference between the first frequency and the second frequency.

In another exemplary aspect, an integrated circuit comprising a circuit to be monitored and a transistor aging monitor circuit are disclosed. The circuit to be monitored comprises a plurality of N-type FETs (NFETs) and a plurality of P-type FETs (PFETs). The transistor aging monitor circuit comprises a stressed ring oscillator circuit comprising a first plurality of stress-enhanced inverter circuits comprising at least one NFET and at least one PFET, the first plurality of stress-enhanced inverter circuits coupled in a first series of stress-enhanced inverter circuits. Each of the first plurality of stress-enhanced inverter circuits comprises a first transistor configured to couple an input node to a first internal node in response to a bias signal; a second transistor configured to couple a supply voltage rail to an inverter output in response to a voltage state of the first internal node, and a third transistor configured to couple a ground voltage rail to the inverter output in response to a voltage state of a second internal node; wherein, in a first mode, one of the first plurality of stress-enhanced inverter circuits in the first series of stress-enhanced inverter circuits is configured to generate a first oscillator signal comprising a first frequency. The transistor aging monitor circuit comprises a reference ring oscillator circuit comprising a second plurality of stress-enhanced inverter circuits comprising at least one NFET and at least one PFET, the second plurality of stress-enhanced inverter circuits coupled in a second series of stress-enhanced inverter circuits, one of the second plurality of stress-enhanced inverter circuits configured to, in the first mode, generate a second oscillator signal comprising a second frequency. The transistor aging monitor circuit also comprises a comparator circuit configured to compare the first frequency to the second frequency and generate an indication of stress-based aging of transistors in a monitored circuit based on a difference between the first frequency and the second frequency.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

Figure 2A:
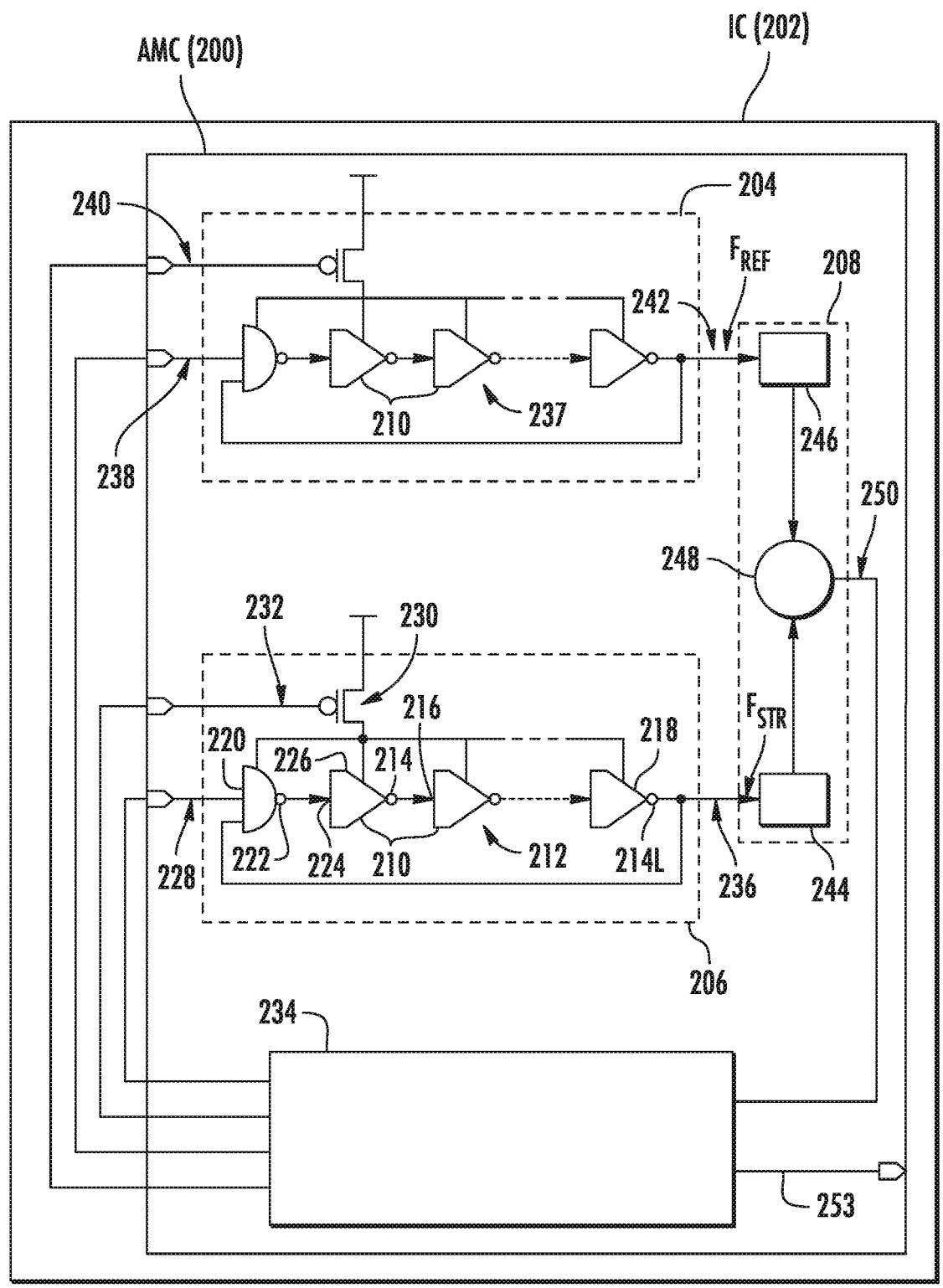
FIG. 2A is a schematic diagram illustrating an exemplary stress-based aging monitor circuit including an exemplary stressed ring oscillator, an exemplary reference ring oscillator, an exemplary frequency comparator circuit, and an exemplary control circuit for monitoring stress-based aging and controlling compensation of transistors for detected performance degradation due to stress-based aging.
Figure 5:
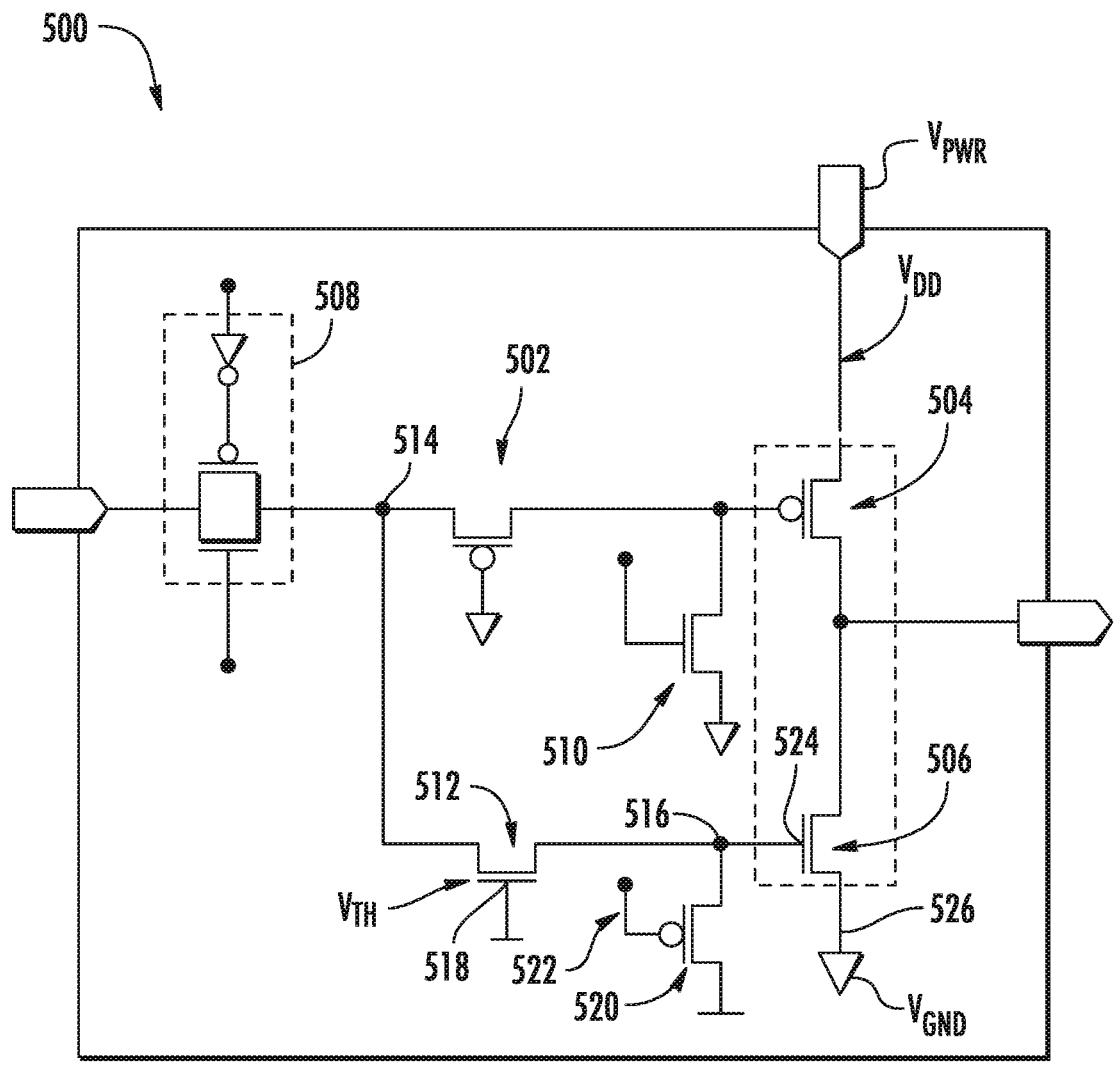
Figure 6:
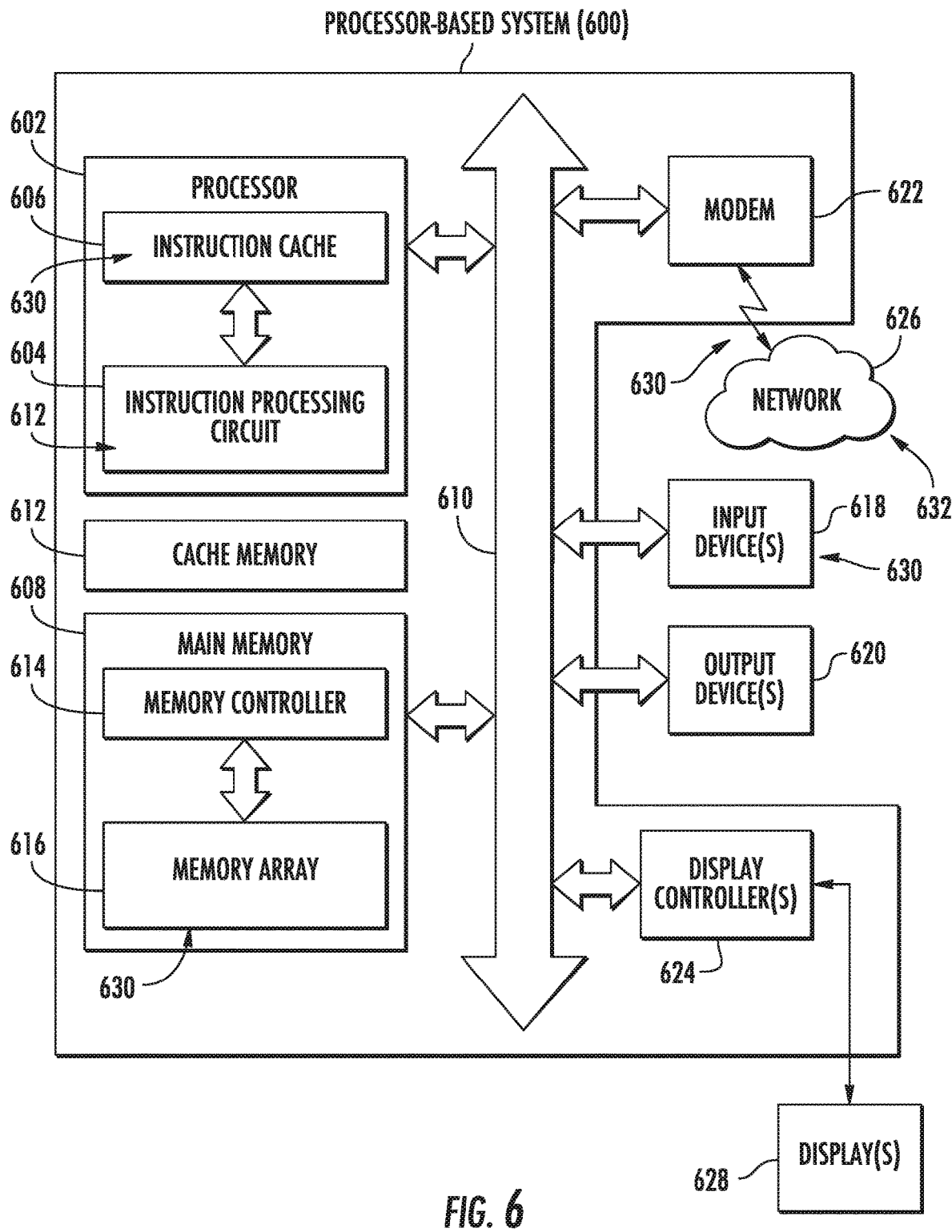

FIG. 5 is a third example of an exemplary stress-enhanced inverter circuit configured to stress N-type or P-type transistors in an oscillating mode and a non-oscillating mode in the ring oscillators circuits of the transistor aging monitor circuit of FIG. 2A; and FIG. 6 is a block diagram of an exemplary processor-based system including a plurality of devices coupled to a system bus, wherein one or more ICs in the processor-based system include an exemplary transistor aging monitor circuit for increased sensitivity to stress-based performance degradation and finer resolution guard band compensation in the supply voltage to avoid wasting power.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include a transistor aging monitor circuit for increased stress-based aging compensation precision. Related methods of detecting stress-based aging and compensating stress-based aging in transistors are also disclosed. The stress-based aging monitor circuit is an integrated circuit (IC) that includes a reference ring oscillator circuit and a stressed ring oscillator circuit that each include transistors like or similar to the transistors in a circuit to be monitored. To approximate the stress applied to the monitored transistors, transistors in the stressed ring oscillator circuit receive a negative gate to source voltage bias while the supply voltage is provided to the aging monitor circuit and the supply voltage is provided to the aging monitor circuit when the supply voltage is provided to the monitored transistors. A reference ring oscillator, in which the transistors are a control group for purposes of comparison, is protected from stress by decoupling the reference ring oscillator from the supply voltage except during a monitoring mode. Then, the switching frequencies of the reference ring oscillator circuit and the stressed ring oscillator circuit are compared to detect transistor stress-based aging in the stressed ring oscillator circuit. Stress-based aging is indicated by a degradation in frequency of an oscillator signal generated by the stressed ring oscillator compared to a frequency of a second oscillator signal generated by the reference ring oscillator. In exemplary aspects herein, the reference ring oscillator and the stressed ring oscillator include stress-enhanced inverter circuits configured to amplify stress-based aging effects to increase sensitivity to the performance degradation caused by stress-based aging. Increased sensitivity increases the precision (e.g., higher resolution) of a supply voltage adjustment used to compensate for the performance degradation to reduce or avoid overcompensating for the effects of stress-based aging.

Stress-based aging of transistors can occur in some of the transistors on an IC whenever power is applied. One effect of stress-based aging is an increase in threshold voltage of the transistor, which slows down the delay (e.g., switching delay) from the time of an applied voltage to the time of a corresponding voltage on a transistor output. One method for compensating a circuit for performance degradation (e.g., increased switching delay) due to increased threshold voltage is to increase the power supply voltage by an amount corresponding to the threshold voltage change. Increasing the supply voltage by more than an amount necessary to overcome a performance degradation wastes power in an IC, which creates more heat and reduces battery life in mobile devices. Therefore, power consumption in a circuit can be reduced by improving the accuracy of detection of the performance degradation of a transistor.

Figure 1:
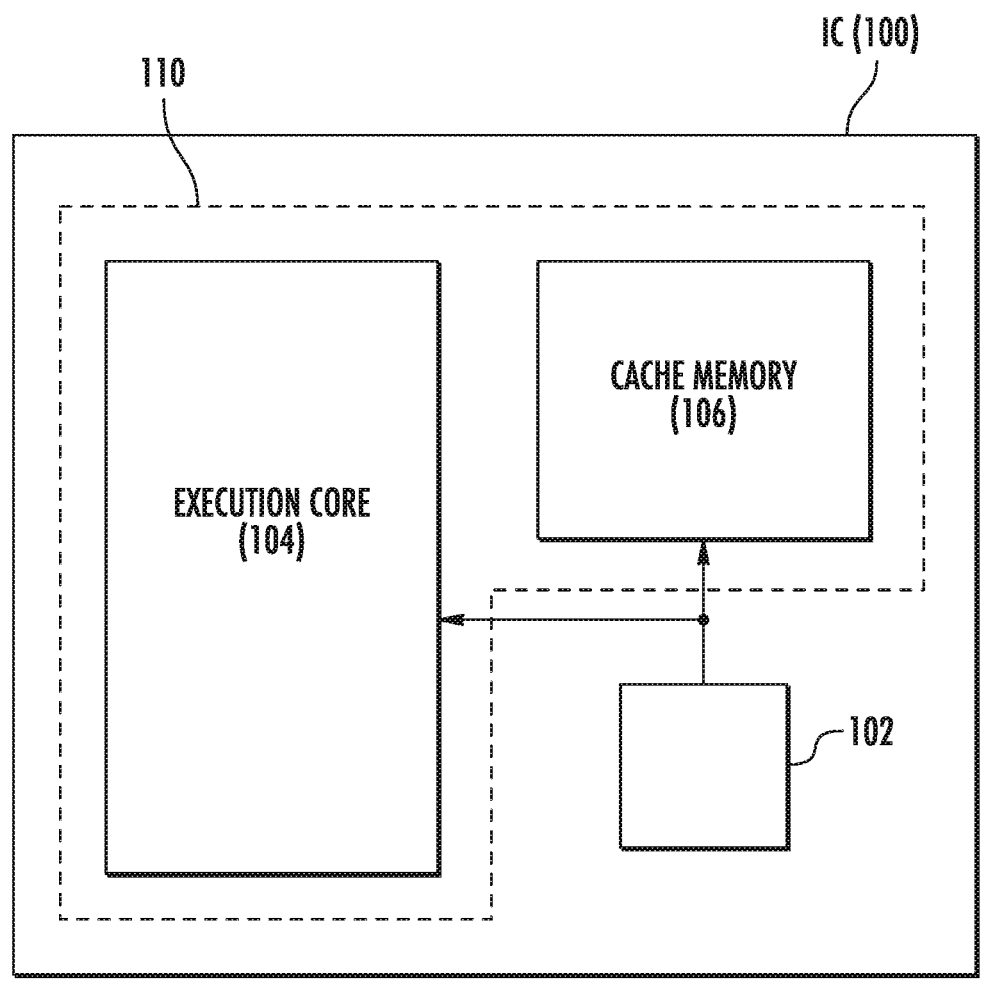
FIG. 1 is a schematic diagram of a processor as an example of an integrated circuit (IC), including a stress-based aging monitor circuit configured to detect stress-based aging to be used to control compensation of transistors for detected performance degradation due to stress-based aging.

FIG. 1 is an illustration of an IC 100 in which an exemplary transistor aging monitor circuit 102 may be employed. The IC 100 in this example includes an execution core 104 and a cache memory 106. The execution core 104 and the cache memory 106 together are a circuit to be monitored 110 by the transistor aging monitor circuit 102. The circuit to be monitored 110 includes at least one N-type field-effect transistor (FET) (NFET) (not shown) and at least one P-type FET (PFET) (not shown). The transistor aging monitor circuit 102 also includes circuits that comprise NFETs and PFETs. Thus, the transistor aging monitor circuit 102 can be used to monitor stress-based aging in the execution core 104 and the cache memory 106 as follows. If the transistors in the circuits of the transistor aging monitor circuit 102 degrade in performance over time due to stress-based aging at about the same rate as transistors in the IC 100 to be monitored, and the performance degradation of the transistors in the transistor aging monitor circuit 102 can be accurately measured, then the performance degradation of the transistors in the rest of the IC 100 can be determined with a high degree of accuracy. Increasing the accuracy of measuring the performance degradation makes it possible to more accurately compensate for the performance degradation. Compensation for performance degradation due to stress-based aging may be provided by a corresponding increase in supply voltage, referred to herein as a guard band. Increasing the supply voltage causes an increase in dynamic power consumption. Adjusting the supply voltage to the extent necessary without applying an overly large guard band makes it possible to compensate for the performance degradation without excessive dynamic power consumption. A detailed illustration of one example of a transistor aging monitor circuit 102 is provided in FIG. 2A.

FIG. 2A is an illustration of a transistor aging monitor circuit 200 (hereinafter "AMC 200") in an IC 202 with circuits to be monitored. The AMC 200 includes a reference ring oscillator circuit 204 and a stressed ring oscillator circuit 206 that each include transistors (not shown) that are of the same or similar type as those in a circuit to be monitored. To approximate the stress applied to the monitored transistors, transistors in the stressed ring oscillator circuit 206 receive the supply voltage whenever the supply voltage is provided to the monitored transistors. In addition, a negative gate to source voltage bias is applied to the transistors in the stressed ring oscillator circuit 206 whenever the supply voltage is provided to the stressed ring oscillator circuit 206. The supply voltage $V_{DD}$ is not provided to the transistors in the reference ring oscillator circuit 204 unless a measurement of performance degradation due to stress-based aging is being performed, and therefore undergo little to no stress-based aging over the life of the IC. In this regard, the transistors of the reference ring oscillator circuit 204 are a control group protected from stress-based aging and used for purposes of comparison to the stressed ring oscillator circuit 206. Each of the stressed ring oscillator circuit 206 and the reference ring oscillator circuit 204 generate an oscillator signal at a frequency corresponding to their respective switching delays. To measure performance degradation using the AMC 200, the frequency of the oscillator signal generated by the reference ring oscillator circuit 204 and the frequency of the oscillator signal generated by the stressed ring oscillator circuit 206 are compared to each other by a comparator circuit 208. As the difference between these frequencies increases due to performance degradation, the guard band applied to the supply voltage to compensate for such degradation also increases.

In exemplary aspects herein, the reference ring oscillator circuit 204 and the stressed ring oscillator circuit 206 include stress-enhanced inverter circuits 210 configured to amplify stress-based aging effects to increase sensitivity to the performance degradation caused by stress-based aging. Increased sensitivity increases the precision (e.g., resolution) of a supply voltage adjustment used to compensate for the performance degradation to reduce or avoid overcompensating for the effects of stress-based aging. In addition, the stress enhanced inverter circuits 210 include at least one transistor that is under stress whenever the supply voltage $V_{DD}$ is provided and the supply voltage $V_{DD}$ is provided to the stressed ring oscillator circuit 206 whenever the supply voltage $V_{DD}$ is provided to the transistors in the circuits to be monitored. Therefore, the transistors in the stressed ring oscillator circuit 206 are stressed for the same amount of time or more than the transistors in the circuits to be monitored. This ensures that the guard band provided to the supply voltage $V_{DD}$ for compensating the performance degradation does not lag behind the actual performance degradation of the circuits being monitored. On the other hand, the supply voltage $V_{DD}$ is only provided to the reference ring oscillator circuit 204 when the performance degradation is being measured, so the transistors in the reference ring oscillator circuit 204 are not aged over time.

Other than the conditions in which the supply voltage is provided, differences between reference ring oscillator circuit 204 and the stressed ring oscillator circuit 206 are avoided so that a comparison of their respective frequencies is only or at least primarily due to a difference in their respective stress-based aging. Thus, the following detailed description of the components and operation of the stressed ring oscillator circuit 206 in FIG. 2A also describes the reference ring oscillator circuit 204.

The stressed ring oscillator 206 includes a plurality of the stress-enhanced inverter circuits 210 coupled in a series 212 in which an output 214 of each of the stress-enhanced inverter circuits 210 is coupled to an input 216 of the next stress-enhanced inverter circuit 210 in the series 212. The output 214L of the last stress-enhanced inverter circuit 218 in the series 212 wraps back to an enable gate 220 comprising an enable gate output 222 is coupled to an input 224 of a first stress-enhanced inverter circuit 226 in the series 212. The enable gate 220 in the example in FIG. 2A is a logical Not-AND (NAND) gate such that a state of the enable gate output 222 is the logical complement of a state of the output 214L of the last stress-enhanced inverter circuit 218 in the series 212 in response to a stressed enable signal 228 being activated. In other embodiments, the enable gate 220 could be implemented as an AND gate. Whether the enable gate output 222 of the enable gate 220 is inverting depends on a number of the stress-enhanced inverter circuits 210 in the series 212, the version needed to cause the output 214L of the last stress-enhanced inverter circuit 218 in the series 212 continues to oscillate. A stressed power circuit 230 is configured to couple the stressed ring oscillator circuit 206 to the supply voltage $V_{DD}$ in response to a stressed power signal 232 in a first power state. In this example, the stressed power circuit 230 is implemented by a P-type field-effect transistor (FET) (PFET), but another type of switching circuit could also be used.

The stressed enable signal 228 and the stressed power signal 232 are both generated by a control circuit 234 of the AMC 200. As described further below, operation of the stressed ring oscillator circuit 206 is controlled by the control circuit 234. In response to both of the stressed enable signal 228 and the stressed power signal 232 being activated, the stressed ring oscillator circuit 206 will generate a stressed oscillator signal 236 that oscillates at a first frequency $F_{STR}$. In a first mode of operation, one of the first plurality of stress-enhanced inverter circuits 210 in the series 212 generates the stressed oscillator signal 236 comprising the first frequency. The reference ring oscillator circuit 204 includes a second plurality of stress-enhanced inverter circuits 210 in a second series 237. The control circuit 234 generates a reference enable signal 238 and a reference power signal 240 for controlling the second series 237 of stress-enhanced inverter circuits 210 in the reference ring oscillator circuit 204 to generate, in the first mode, a reference oscillator signal 242 that oscillates at a second frequency $F_{REF}$. In the first mode, the stressed power signal 232 is in a first power state, the stressed enable signal 228 is in a first enable state, the reference power signal 240 is in the first power state, and the reference enable signal 238 is in the first enable state.

The comparator circuit 208 is used to compare the first frequency $F_{STR}$ to the second frequency $F_{REF}$ when the supply voltage $V_{DD}$ is provided to the reference ring oscillator circuit 204 and the reference ring oscillator circuit 204 is enabled for the purpose of measuring performance degradation. The comparator circuit 208 includes a first oscillator counter circuit 244 that counts a number of times the stressed oscillator signal 236 oscillates between two states (e.g., a high voltage state and a low voltage state). The comparator circuit 208 also includes a second oscillator counter circuit 246 that counts a number of times the reference oscillator signal 242 oscillates between the two states. The comparator circuit 208 further includes an arithmetic circuit 248 in which a difference is determined between the count from the first oscillator counter circuit 244 and the count from the second oscillator counter circuit 246. The comparator circuit 208 generates an indication $F_{DIFF}$ of stress-based aging of transistors in a monitored circuit (not shown) based on a difference between the first frequency $F_{STR}$ and the second frequency $F_{REF}$. A measurement of the performance degradation using the AMC 200 is performed as follows.

The control circuit 234 activates the stressed power signal 232 and the reference power signal 240 to provide the supply voltage $V_{DD}$ to the stressed ring oscillator circuit 206 and the reference ring oscillator circuit 204, respectively. The first oscillator counter circuit 244 and the second oscillator counter circuit 246 are reset, so they are both at a same value (e.g., reset to zero). The stressed enable signal 228 and the reference enable signal 238 are activated by the control circuit 234 at the same time (e.g., simultaneously), held in an active state for a measurement period, and then deactivated at the same time, such that a total time that each of the stressed enable signal 228 and the reference enable signal 238 are activated is the same. The first oscillator counter circuit 244 and the second oscillator counter circuit 246 count the number of oscillations in the stressed oscillator signal 236 and the reference oscillator signal 242, respectively. The arithmetic circuit 248 determines a difference between the respective numbers. A difference signal 250 indicating a difference in the numbers over the measurement period indicates a difference in frequency between the first frequency $F_{STR}$ and the second frequency $F_{REF}$. The difference signal 250 is provided to the control circuit 234. The control circuit 234 in FIG. 2A generates a control signal 253 to a supply voltage control circuit (not shown) that provides a compensated supply voltage $V_{DD}$+GB that includes a guard band added to the supply voltage $V_{DD}$ based on the difference in frequency indicated by the difference signal 250.

In a second mode of operation of the AMC 200, when no measurement of performance degradation is being performed, the stress-enhanced inverter circuits 210 remain coupled to the supply voltage $V_{DD}$ to continue aging along with the circuits to be monitored. For this reason, the stressed ring oscillator circuit 206 remains coupled to the supply voltage $V_{DD}$. However, since performance degradation is not measured, the reference ring oscillator circuit 204 is decoupled from the supply voltage rail $V_{PWR}$ to protect the reference ring oscillator circuit 204 from stress-based aging. A reference power circuit 251 is configured to couple the reference ring oscillator circuit 204 to the supply voltage rail $V_{PWR}$ in response to a reference power signal 240 in the first power state. In the second mode, the reference power signal 240 is generated in a second power state to decouple the reference ring oscillator circuit 204 from the supply voltage rail $V_{PWR}$. Then, the reference enable signal 238 is generated in the second enable state. However, in view of the reference ring oscillator circuit 204 being decoupled from the supply voltage $V_{DD}$, it may be unnecessary to also set the reference enable signal 238 to disable the reference ring oscillator circuit 204. In addition, in the second mode, the stressed power signal 232 is in the first power state, and the stressed enable signal 228 is in the first enable state.

Figure 2B:
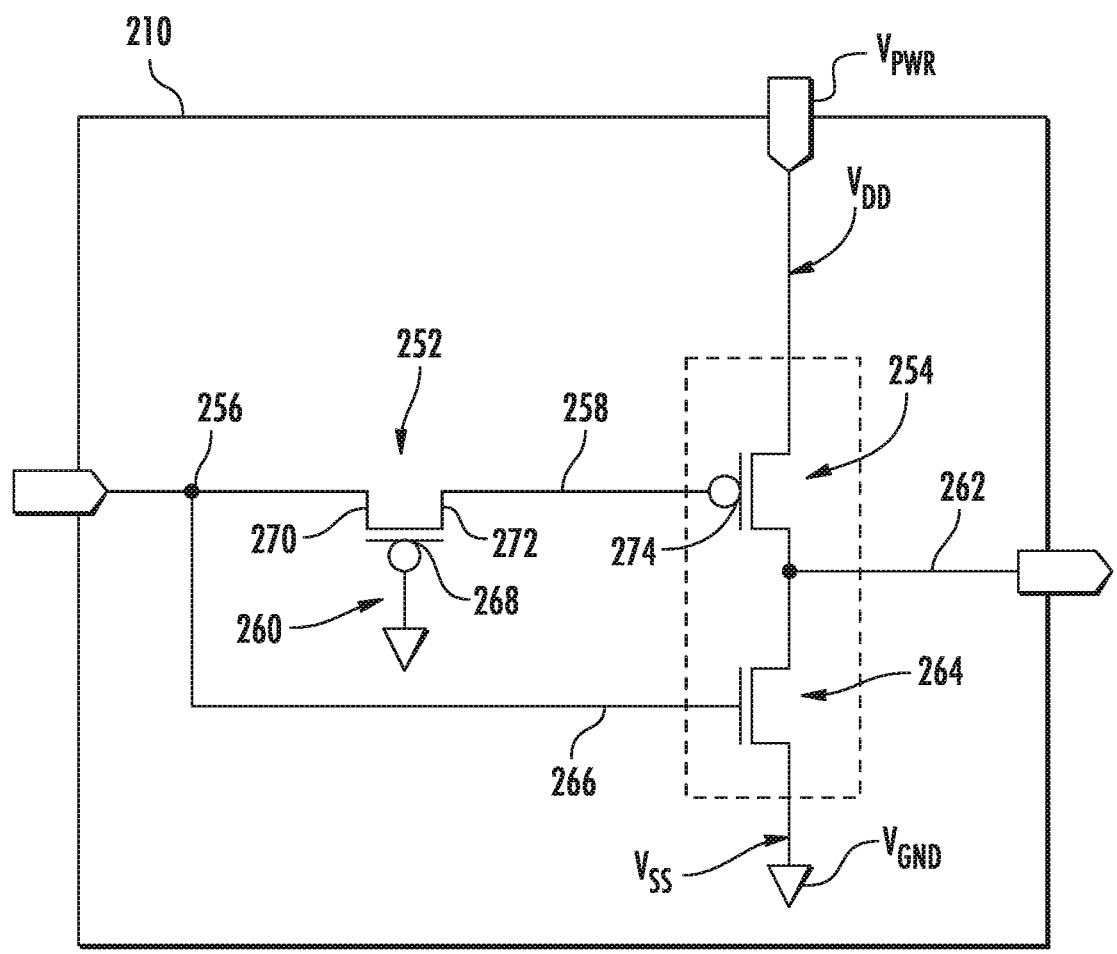
FIG. 2B is a first example of an exemplary stress-enhanced inverter circuit employed in the reference ring oscillator circuit and the stressed ring oscillator circuit in the transistor aging monitor circuit in FIG. 2A.

FIG. 2B is an illustration of a stress-enhanced inverter circuit 210 configured to improve accuracy of stress-based aging detection in the AMC 200 to reduce excess guard band being applied to a supply voltage to compensate performance degradation. Operation of the stress-enhanced inverter circuit 210 includes providing a gate to source bias voltage to maintain at least one transistor (e.g., P-type transistor) under stress in each operating mode when the stress-enhanced inverter circuit 210 is coupled to a supply voltage rail (e.g., $V_{PWR}$). In this way, transistors of the AMC 200 are aged under stress to the same or greater extent than the transistors to be monitored and, therefore, do not allow stress-based performance degradation of the transistors being monitored to be under-compensated. In addition, the stress-enhanced inverter circuit 210 amplifies the stress-based aging of a first transistor 252 through a second transistor 254 to increase sensitivity of the AMC 200. The stress-enhanced inverter circuit 210 includes the first transistor 252 configured to couple an input node 256 to a first internal node 258 in response to a bias signal 260. The stress-enhanced inverter circuit 210 includes the second transistor 254 configured to couple an inverter output 262 to a supply voltage rail $V_{PWR}$ in response to a voltage state of the first internal node 258. The stress-enhanced inverter circuit 210 also includes a third transistor 264 configured to couple the inverter output 262 to a ground voltage rail $V_{GND}$ in response to a voltage state of a second internal node 266. In operation in the first mode, a voltage state on the input node 256 generates a complementary voltage state on the inverter output 262.

The first transistor 252 includes a gate 268 that receives a bias voltage 260. The bias voltage 260 in the example in FIG. 2B is a ground voltage $V_{SS}$ (e.g., 0 volts) provided by the ground voltage rail $V_{GND}$. The first transistor 252 in this example is a PFET, which is "turned on" by the ground voltage $V_{SS}$ and passes a strong, high voltage (e.g., logic 1) from a first source/drain 270 to a second source/drain 272. The first transistor 252 passes a high voltage $V_{DD}$ from the input node 256 to a high voltage $V_{DD}$ on the first internal node 258. However, a PFET passes a low voltage (e.g., logic 0) poorly. The first transistor 252 passes a low voltage $V_{SS}$ to the first internal node 258 as a slightly higher voltage (e.g., $V_{GND}+V_{TH}$) based on the threshold voltage $V_{TH}$ of the first transistor 252. Therefore, during a first mode of operation, in which the stressed ring oscillator circuit 206 oscillates and generates the stressed oscillator signal 236, the second source/drain 272 remains at a voltage above ground voltage $V_{SS}$ whether the stress-enhanced inverter circuit 210 receives a high voltage $V_{DD}$ or a low voltage $V_{SS}$ on the input node 256. Thus, the gate 268 of the first transistor 252 (coupled to the ground voltage rail $V_{GND}$) remains at a lower voltage than the second source/drain 272. As a result, independent of a state (e.g., voltage) of the input node 258, the gate 268 is negatively biased with respect to the second source/drain 272. This keeps the first transistor 252 in a stressed condition, causing the first transistor 252 to undergo stress-based aging at the same or higher rate than transistors in a circuit to be monitored by the AMC 200.

In the first mode of operation of the stressed ring oscillator circuit 206, the voltage on the first internal node 258 oscillates between a high voltage (e.g., $V_{DD}$) and a low voltage ($V_{SS}$) corresponding to the voltage on the input node 256. The first internal node 258 is coupled to a gate 274 of the second transistor 254, and the oscillating voltage on the gate 274 causes the second transistor 254 to switch back and forth between an "on" state and an "off" state. Since the first internal node 258 in the low voltage state stays at a higher voltage than the ground voltage $V_{SS}$ in the low voltage state (i.e., $V_{SS}+V_{TH}$), and the second transistor 254 in FIG. 2B is a PFET (i.e., turned fully on by a low voltage, $V_{SS}$), the second transistor 254 is not fully turned on in the "on" state. By not fully turning on the second transistor 254, the time for the second transistor 254 to switch from one voltage state to another state (e.g., from $V_{SS}$ to $V_{DD}$) on the inverter output 262 is greater than if the second transistor 254 was turned on fully. Thus, a delay of the first transistor 252 is amplified by the second transistor 254, compounding the respective delays for a greater total delay. Increasing the total switching delay of the stress-enhanced inverter circuits 210 reduces the first frequency of the stressed oscillator signal 236. In this manner, a small performance degradation of the first transistor 252 and the second transistor 254 causes a marked increase in the first frequency of the stressed oscillator signal 236 allowing the AMC 200 to respond to smaller amounts of performance degradation with a finer resolution of compensation in the form of a guard band on the supply voltage.

Figure 3A:
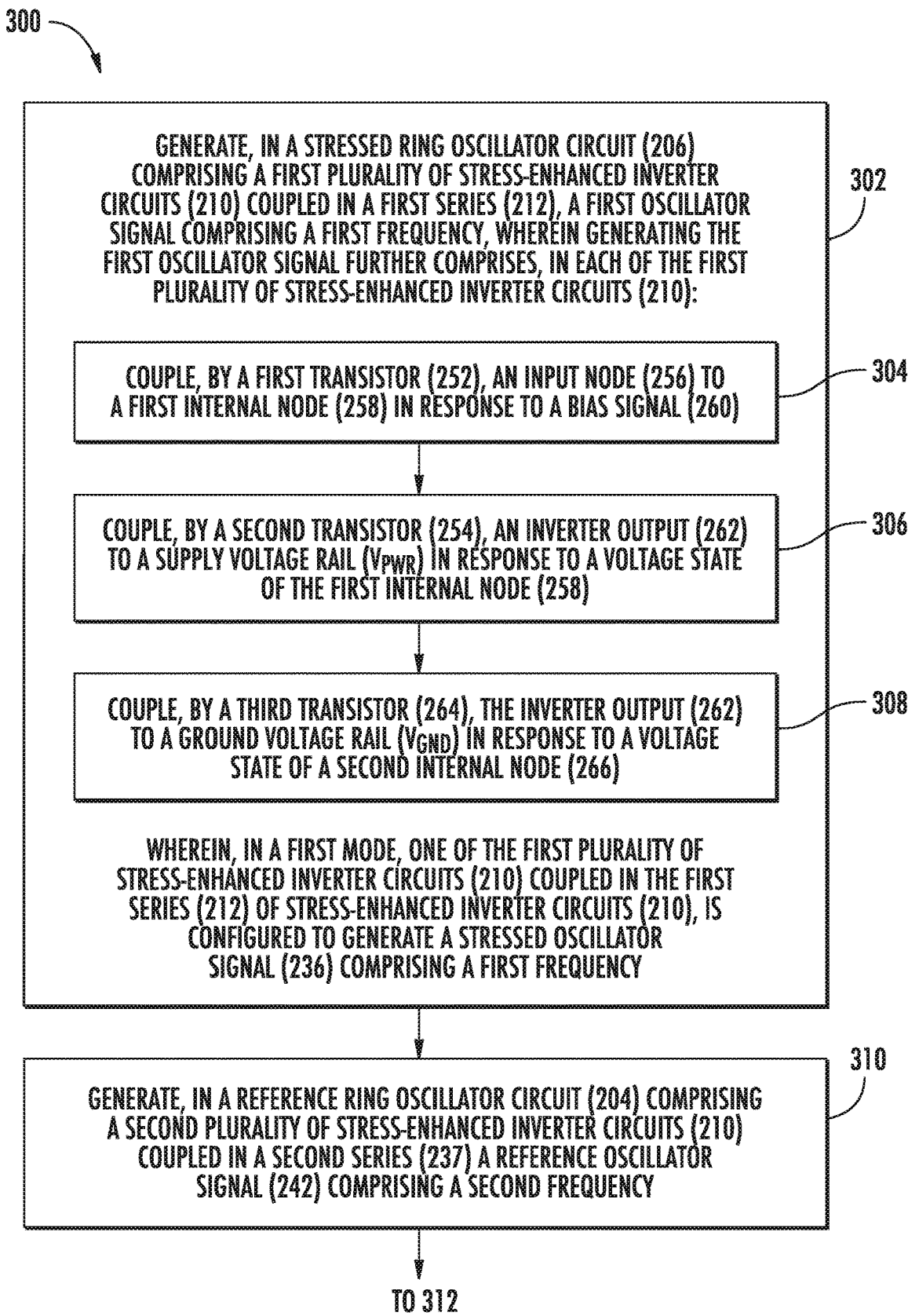
FIGS. 3A and 3B are a flow chart illustrating an exemplary process of more accurately detecting and compensating for stress-based aging in an IC using the exemplary transistor aging monitor circuit in FIG. 2A.
Figure 3B:
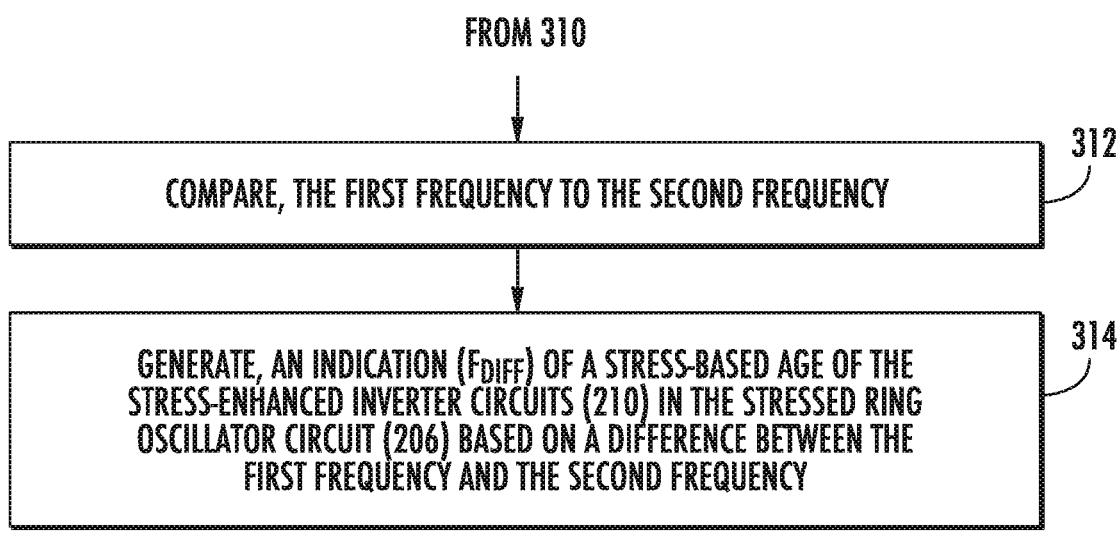

FIGS. 3A and 3B are a flowchart of an exemplary process 300 of operation of the AMC 200 in FIGS. 2A and 2B in a first mode. The method 300 includes generating, in a stressed ring oscillator circuit 206 comprising a first plurality of stress-enhanced inverter circuits 210 coupled in a first series 212, a first oscillator signal comprising a first frequency. Generating the first oscillator signal further comprises, in each of the first plurality of stress-enhanced inverter circuits 210 (block 302): coupling, by a first transistor 252, an input node 256 to a first internal node 258 in response to a bias signal 260 (block 304); coupling, by a second transistor 254, an inverter output 262 to a supply voltage rail $V_{PWR}$ in response to a voltage state of the first internal node 258 (block 306); and coupling, by a third transistor 264, the inverter output 262 to a ground voltage rail $V_{GND}$ in response to a voltage state of the second internal node 266 (block 308); wherein, in a first mode, one of the first plurality of stress-enhanced inverter circuits 210 in the first series 212 of stress-enhanced inverter circuits 210 is configured to generate a first oscillator signal 236 comprising a first frequency. The method further comprises generating, in a reference ring oscillator circuit 204 comprising a second plurality of stress-enhanced inverter circuits 210 coupled in a second series 237 of stress-enhanced inverter circuits 210, a reference oscillator signal 242 comprising a second frequency (block 310), comparing, in a comparator circuit 208, the first frequency to the second frequency (block 312) and generating an indication $F_{DIFF}$ of a stress-based age of the stress-enhanced inverter circuits 210 in the stressed ring oscillator circuit 206 based on a difference between the first frequency and the second frequency (block 314).

Figure 4:
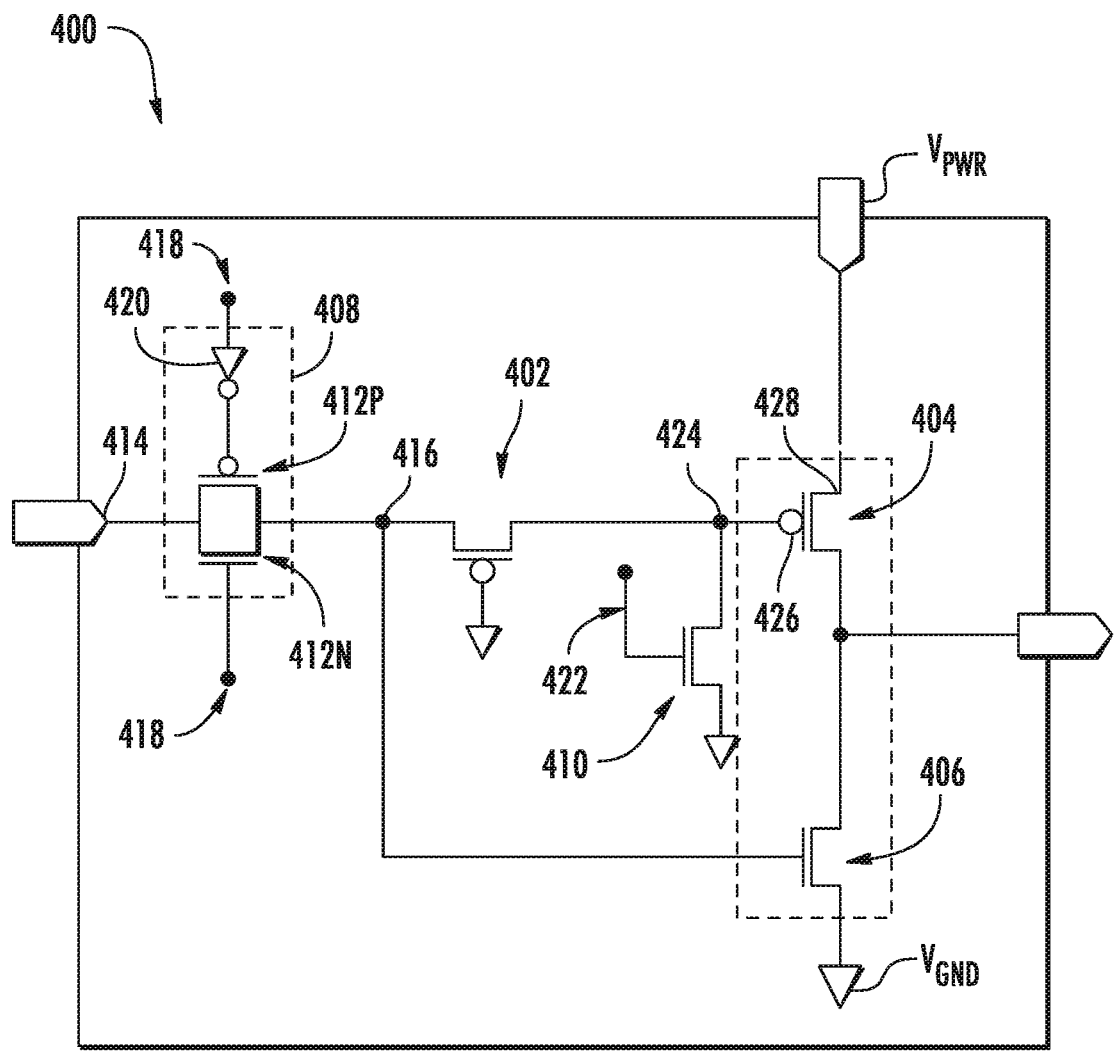
FIG. 4 is a second example of an exemplary stress-enhanced inverter circuit configured to stress transistors in an oscillating mode and a non-oscillating mode in the ring oscillators circuits of the transistor aging monitor circuit of FIG. 2A.

FIG. 4 is an illustration of a stress-enhanced inverter circuit 400 that may be employed in a transistor aging monitor circuit, which may be employed in ring oscillator circuits, such as the stressed ring oscillator circuit 206 and the reference ring oscillator circuit 204 in FIG. 2A. Operation of the stress-enhanced inverter circuit 400 is explained herein with reference to FIG. 4 and FIG. 2A. The stress-enhanced inverter circuit 400 is similar to the stress-enhanced inverter circuit 206 in FIG. 2B, including a first transistor 402, a second transistor 404, and a third transistor 406 corresponding to the first transistor 252, second transistor 254, and third transistor 264, respectively, in FIG. 2B. The stress-enhanced inverter circuit 400 also includes a pass-gate circuit 408 and a pull-down circuit 410, which are used together in a second mode of operation. The pass-gate circuit 408 shown in FIG. 4 is a CMOS pass-gate circuit including a PFET 412P and an NFET 412N coupled in parallel between the inverter input 414 and the input node 416. The pass-gate circuit 408 is controlled by an enable signal 418 that is generated in a control circuit (not shown). An inverter 420 is included in the pass-gate circuit 408 to avoid the necessity for providing true and complementary versions of the enable signal 418. The pass-gate circuit 408 couples the inverter input 414 to the input node 416 in response to the enable signal 418 being in a first enable state and decouples the inverter input 414 from the input node 416 in response to the enable signal 418 being in a second enable state. Referring back to FIG. 2A, the enable gate 220 was inserted into a ring of the stress-enhanced inverter circuits 210 in the ring oscillator circuit 206 to enable or disable the first mode of operation in which the stress-enhanced inverter circuits 210 oscillate between high and low voltages. Here, the pass-gate circuit 408 can disable or enable each of the stress-enhanced inverter circuits 400 in a ring oscillator. Thus, a transistor aging monitor circuit (not shown) may employ the pass-gate circuit 408 in addition to or as an alternative to the enable gate 220 to enable or disable the first mode of operation of the stress-enhanced inverter circuits 400.

The pass-gate circuit 408 is provided to control a mode of operation of the stress-enhanced inverter circuits 400 and, thus, a mode of operation of the AMC 200. In the third mode, oscillation of the stressed ring oscillator circuit 206 in FIG. 2A is paused to reduce dynamic power consumption while continuing to stress the second transistor 404 in each of the stress-enhanced inverter circuits 400. The reference ring oscillator circuit 204 is decoupled from the supply voltage rail $V_{PWR}$. Therefore, in the third mode, the reference power signal 240 is in the second power state (i.e., shut off), the reference enable signal 238 is in the second enable state, the stressed power signal 232 is in the first power state, and the stressed enable signal 228 is in the second enable state to disable oscillation of the stressed ring oscillator circuit 206.

The pull-down circuit 410 is employed in the third mode to provide a negative gate to source bias voltage on the second transistor 404. The pull-down circuit 410 is controlled by a first pull-down signal 422, which, in a first pull-down state, keeps a first internal node 424 decoupled from the ground voltage rail $V_{GND}$. The first pull-down signal 422 in a second pull-down state couples the first internal node 424 to the ground voltage rail $V_{GND}$. Thus, in the third mode of operation, the first pull-down signal 422 is in the second pull-down state, keeping a gate 426 of the second transistor 404 at a negative bias with respect to a source/drain terminal 428 coupled to the supply voltage rail $V_{PWR}$ to continue stressing at least one transistor in the stress-enhanced inverter circuit 400 while the circuit to be monitored is coupled to the supply voltage rail $V_{PWR}$.

FIG. 5 is an illustration of a stress-enhanced inverter circuit 500 in another example. The stress-enhanced inverter circuit 500 includes a first transistor 502, a second transistor 504, and a third transistor 506, which correspond, respectively, to the first transistor 402, the second transistor 404, and the third transistor 406 in the stress-enhanced inverter circuit 400 in FIG. 4. The stress-enhanced inverter circuit 500 includes a pass-gate circuit 508 and a pull-down circuit 510, which correspond, respectively, to the pass-gate circuit 408 and the pull-down circuit 410 in FIG. 4. In addition, the stress-enhanced inverter circuit 500 includes a fourth transistor 512 that couples an input node 514 to a second internal node 516. The fourth transistor 512 is an NFET transistor in this example and includes a gate 518 coupled to the supply voltage rail $V_{PWR}$, which keeps the fourth transistor turned on. The fourth transistor passes a low voltage well but passes a high voltage weakly, meaning that, for example, the supply voltage $V_{DD}$ provided on the input node 514 is reduced by the threshold voltage $V_{TH}$ of the fourth transistor 512. The stress-enhanced inverter circuit 500 also includes pull-up circuit 520 that is configured to decouple the second internal node 516 from the supply voltage rail $V_{PWR}$ in response to a pull-up signal 522 being in a first pull-up state, and couple the second internal node 516 to the supply voltage rail $V_{PWR}$ in response to the pull-up signal 522 being in a second pull-up state. The purpose of the pull-up circuit 520 is, in a fourth mode of operation, to stress the third transistor 506 while the stressed ring oscillator circuit 206 is disabled to reduce dynamic power consumption. In this regard, the pull-up circuit 520 is employed in the fourth mode with respect to the third transistor 506 in a manner similar to the use of the pull-down circuit 510 with respect to the second transistor 504 in the third mode. In the fourth mode, by turning on the pull-up circuit 520 to couple the second internal node 516 to the supply voltage rail $V_{PWR}$, a gate 524 of the third transistor 506 is held at a high voltage relative to a source/drain terminal 526 coupled to the ground voltage rail $V_{GND}$, keeping the third transistor 506 (NFET) in a stressed state. A transistor aging monitor circuit including the stress-enhanced inverter circuits 500 can operate in any of the first, second, third, and fourth modes.

FIG. 6 is a block diagram of an exemplary processor-based system 600 that includes a processor 602 (e.g., a microprocessor) that includes an instruction processing circuit 604. The processor-based system 600 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 600 includes the processor 602. The processor 602 represents one or more general-purpose processing circuits, such as a microprocessor, central processing unit, or the like. More particularly, the processor 602 may be an EDGE instruction set microprocessor or other processor implementing an instruction set that supports explicit consumer naming for communicating produced values resulting from execution of producer instructions. The processor 602 is configured to execute processing logic in instructions for performing the operations and steps discussed herein. In this example, the processor 602 includes an instruction cache 606 for temporary, fast access memory storage of instructions accessible by the instruction processing circuit 604. Fetched or prefetched instructions from a memory, such as a main memory 608, over a system bus 610, are stored in the instruction cache 606. Data may be stored in a cache memory 612 coupled to the system bus 610 for low-latency access by the processor 602. The instruction processing circuit 604 is configured to process instructions fetched into the instruction cache 606 and process the instructions for execution.

The processor 602 and the main memory 608 are coupled to the system bus 610 and can intercouple peripheral devices included in the processor-based system 600. As is well known, the processor 602 communicates with these other devices by exchanging address, control, and data information over the system bus 610. For example, the processor 602 can communicate bus transaction requests to a memory controller 614 in the main memory 608 as an example of a slave device. Although not illustrated in FIG. 6, multiple system buses 610 could be provided; wherein each system bus 610 constitutes a different fabric. In this example, the memory controller 614 is configured to provide memory access requests to a memory array 616 in the main memory 608. The memory array 616 is comprised of an array of storage bit cells for storing data. The main memory 608 may be a read-only memory (ROM), flash memory, dynamic random-access memory (DRAM), such as synchronous DRAM (SDRAM), etc., and/or static memory (e.g., flash memory, SRAM, etc.), as non-limiting examples.

Other devices can be connected to the system bus 610. As illustrated in FIG. 6, these devices can include the main memory 608, one or more input device(s) 618, one or more output device(s) 620, a modem 622, and one or more display controllers 624, as examples. The input device(s) 618 can include any type of input device, including but not limited to input keys, switches, voice processors, etc. The output device(s) 620 can include any type of output device, including but not limited to audio, video, other visual indicators, etc. The modem 622 can be any device configured to allow exchange of data to and from a network 626. The network 626 can be any type of network, including but not limited to a wired or wireless network, a private or public network, a local area network (LAN), a wireless local area network (WLAN), a wide area network (WAN), a BLUETOOTH™ network, and the Internet. The modem 622 can be configured to support any type of communications protocol desired. The processor 602 may also be configured to access the display controller(s) 624 over the system bus 610 to control information sent to one or more displays 628. The display(s) 628 can include any type of display, including but not limited to a cathode ray tube (CRT), a liquid crystal display (LCD), a plasma display, etc.

The processor-based system 600 in FIG. 6 may include a set of instructions 630 to be executed by the processor 602 for any application desired according to the instructions. The instructions 630 may be stored in the main memory 608, processor 602, and/or instruction cache 606 as examples of a non-transitory computer-readable medium 632. The instructions 630 may also reside, completely or at least partially, within the main memory 608 and/or within the processor 602 during their execution. The instructions 630 may further be transmitted or received over the network 626 via the modem 622, such that the network 626 includes computer-readable medium 632.

While the computer-readable medium 632 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The processor 602 in the processor-based system 600 may include, in any of the devices therein, an exemplary transistor aging monitor circuit for increased sensitivity to stress-based performance degradation and higher resolution guard band compensation applied to the supply voltage to avoid excessive dynamic power consumption, as illustrated in FIGS. 2A and 2B.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A transistor aging monitor circuit comprising:
  a stressed ring oscillator circuit comprising a first plurality of stress-enhanced inverter circuits coupled in a first series of stress-enhanced inverter circuits, each of the first plurality of stress-enhanced inverter circuits comprising:
    a first transistor configured to couple an input node to a first internal node in response to a bias signal;
    a second transistor configured to couple a supply voltage rail to an inverter output in response to a voltage state of the first internal node; and
    a third transistor configured to couple a ground voltage rail to the inverter output in response to a voltage state of a second internal node;
    wherein, in a first mode, one of the first plurality of stress-enhanced inverter circuits in the first series of stress-enhanced inverter circuits is configured to generate a first oscillator signal comprising a first frequency;
  a reference ring oscillator circuit comprising a second plurality of stress-enhanced inverter circuits coupled in a second series of stress-enhanced inverter circuits, one of the second plurality of stress-enhanced inverter circuits configured to, in the first mode, generate a second oscillator signal comprising a second frequency; and
  a comparator circuit configured to:
    compare the first frequency to the second frequency; and
    generate an indication of stress-based aging of transistors in a monitored circuit based on a difference between the first frequency and the second frequency.

2. The transistor aging monitor circuit of claim 1, the first transistor comprises a gate configured to couple to the ground voltage rail to:
  couple a first source/drain terminal of the first transistor to a second source/drain terminal of the first transistor; and
  independent of a state of the inverter input, negatively bias the gate with respect to a second source/drain terminal coupled to the first internal node.

3. The transistor aging monitor circuit of claim 1, further comprising:
  in the stressed ring oscillator circuit, an enable gate circuit comprising:
    a signal input coupled to an output of a last stress-enhanced inverter circuit in the first series to receive a stressed output signal;
    an enable input configured to receive a stressed enable signal; and
    a stressed enable gate output coupled to an input of a first stress-enhanced inverter circuit in the first series;

wherein a state of the stressed enable gate output is based on the stressed output signal in response to the stressed enable signal comprising a first enable state; and in the reference ring oscillator circuit, an enable gate circuit comprising:
a signal input coupled to an output of a last stress-enhanced inverter circuit in the second series to receive a reference output signal;
an enable input configured to receive a reference enable signal; and
a reference enable gate output coupled to an input of a first stress-enhanced inverter circuit in the second series;
wherein a state of the reference enable gate output is based on the reference output signal in response to the reference enable signal comprising the first enable state.

4. The transistor aging monitor circuit of claim 3, further comprising:
a stressed power circuit configured to couple the stressed ring oscillator circuit to the supply voltage rail in response to a stressed power signal in a first power state; and
a reference power circuit configured to couple the reference ring oscillator circuit to the supply voltage rail in response to a reference power signal in the first power state.

5. The transistor aging monitor circuit of claim 4, further comprising a control circuit configured to generate, in the first mode:
the stressed power signal in the first power state;
the stressed enable signal in the first enable state;
the reference power signal in the first power state; and
the reference enable signal in the first enable state.

6. The transistor aging monitor circuit of claim 5, further comprising,
in each of the stress-enhanced inverter circuits in the first plurality of stress-enhanced inverter circuits:
a pass-gate circuit configured to couple the inverter input to the input node in response to the stressed enable signal in the first enable state; and
a pull-down circuit configured to couple the first internal node to the ground voltage rail in response to a first pull-down signal in a first pull-down state; and
in each of the stress-enhanced inverter circuits in the second plurality of stress-enhanced inverter circuits:
a pass-gate circuit configured to couple the inverter input to the input node in response to the reference enable signal in the first enable state; and
a pull-down circuit configured to couple the first internal node to the ground voltage rail in response to the first pull-down signal in the first pull-down state.

7. The transistor aging monitor circuit of claim 6, the control circuit configured to, in the first mode, generate the first pull-down signal in the first pull-down state.

8. The transistor aging monitor circuit of claim 5, wherein the control circuit is further configured to, in a second mode:
generate the stressed power signal in the first power state;
generate the stressed enable signal in the first enable state;
generate the reference power signal in a second power state to decouple the reference ring oscillator from the supply voltage rail to stop generating the second oscillator signal; and
generate the reference enable signal in a second enable state to control the pass-gate circuit in each of the stress-enhanced inverter circuits in the second series to decouple the inverter input from the first transistor.

9. The transistor aging monitor circuit of claim 8, wherein the control circuit is further configured to, in a third mode:
generate the reference power signal in the second power state;
generate the reference enable signal in the second enable state;
generate the stressed power signal in the first power state;
generate the stressed enable signal in the second enable state; and
generate the first pull-down signal in a second pull-down state to couple the first internal node to the ground voltage rail to negatively bias a gate of the second transistor.

10. The transistor aging monitor circuit of claim 4, each of the stress-enhanced inverter circuits in the first plurality of stress-enhanced inverter circuits and the second plurality of stress-enhanced inverter circuits further comprising:
a fourth transistor comprising a gate configured to couple to a bias signal to control the fourth transistor to couple the input node to the second internal node; and
a pull-up circuit configured to:
in the first mode, the second mode, and the third mode, decouple the second internal node from the supply voltage rail in response to a pull-up signal in a first pull-up state; and
in a fourth mode, couple the second internal node to the supply voltage rail in response to a pull-up signal in a second pull-up state.

11. A method of monitoring transistor aging in an integrated circuit, the method comprising, in a first mode:
generating, in a stressed ring oscillator circuit comprising a first plurality of stress-enhanced inverter circuits coupled in a first series of stress enhanced inverter circuits, a first oscillator signal comprising a first frequency, wherein generating the first oscillator signal further comprises, in each of the first plurality of stress-enhanced inverter circuits:
coupling, by a first transistor, an input node to a first internal node in response to a bias signal;
coupling, by a second transistor, an inverter output to a supply voltage rail in response to a voltage state of the first internal node; and
coupling, by a third transistor, the inverter output to a ground voltage rail in response to a voltage state of a second internal node;
wherein one of the first plurality of stress-enhanced inverter circuits in the first series of stress-enhanced inverter circuits is configured to generate the first oscillator signal comprising the first frequency;
generating, in a reference ring oscillator circuit comprising a second plurality of stress-enhanced inverter circuits coupled in a second series of stress-enhanced inverter circuits, a second oscillator signal comprising a second frequency;
comparing, in a comparator circuit, the first frequency to the second frequency; and
generating an indication of a stress-based age of the stress-enhanced inverter circuits in the stressed ring oscillator based on a difference between the first frequency and the second frequency.

12. The method of claim 11, wherein coupling the input node to the first internal node further comprises coupling a gate of the first transistor to a bias voltage to:

couple a first source/drain terminal of the first transistor to a second source/drain terminal of the first transistor; and negatively bias a gate of the first transistor with respect to the second source/drain terminal independent of a state of the input node.

13. The method of claim 12, further comprising, in a control circuit in the first mode:
   generating a stressed power signal in a first power state to couple the stressed ring oscillator circuit to the supply voltage rail;
   generating a stressed enable signal in a first enable state to control the stressed ring oscillator circuit to generate the stressed oscillator signal;
   generating a reference power signal in the first power state to couple the reference ring oscillator circuit to the supply voltage rail; and
   generating a reference enable signal in the first enable state to control the reference ring oscillator circuit to generate the reference oscillator signal.

14. The method of claim 13, further comprising, in the first mode:
   generating, in the control circuit, a first pull-down signal in a first pull-down state;
   in each stress enhanced inverter circuit in the stressed ring oscillator circuit:
      in response to the stressed enable signal in the first enable state, coupling an inverter input comprising the input signal to the first source/drain terminal of the first transistor; and
      in response to the pull-down signal in the first pull-down state, decoupling the first internal node from the ground voltage rail; and
   in each stress enhanced inverter circuit of the reference ring oscillator circuit:
      in response to the reference enable signal in the first enable state, coupling an inverter input comprising the input signal to the first source/drain terminal of the first transistor; and
      in response to the first pull-down signal in the first pull-down state, decoupling the first internal node from the ground voltage rail.

15. The method of claim 14, further comprising, in the first mode:
   generating, in the control circuit, a pull-up signal in a first pull-up state; and
   in each stress-enhanced inverter circuit in the stressed ring oscillator circuit, in response to the pull-up signal in the first pull-up state, decoupling the second internal node from the supply voltage rail.

16. The method of claim 12, further comprising, in the control circuit in a second mode:
   generating the stressed power signal in the first power state to couple the stressed ring oscillator circuit to the supply voltage rail;
   generating the stressed enable signal in the first enable state to control the stressed ring oscillator circuit to generate the stressed oscillator signal;
   generating the reference power signal in a second power state to decouple the reference ring oscillator circuit from the supply voltage rail; and
   generating the reference enable signal in a second enable state.

17. The method of claim 16, further comprising, in the control circuit in a third mode:
   generating the stressed power signal in the first power state to couple the stressed ring oscillator circuit to the supply voltage rail;
   generating the stressed enable signal in the second enable state to control the stressed ring oscillator circuit to not generate the stressed oscillator signal;
   generating the reference power signal in the second power state to decouple the reference ring oscillator circuit from the supply voltage rail; and
   generating the reference enable signal in the second enable state.

18. The method of claim 17, further comprising, in the third mode:
   generating, in the control circuit, the first pull-down signal in a second pull-down state; and
   in each stress enhanced inverter circuit in the stressed ring oscillator circuit:
      in response to the stressed enable signal in the second enable state, decoupling the inverter input from the first source/drain terminal of the first transistor; and
      in response to the first pull-down signal in the second pull-down state, coupling the first internal node to the ground voltage rail.

19. The method of claim 18, further comprising, in the third mode:
   generating, in the control circuit, the pull-up signal in the first pull-up state; and
   in each stress-enhanced inverter circuit in the stressed ring oscillator circuit, in response to the pull-up signal in the first pull-up state, decoupling the second internal node from the supply voltage rail.

20. The method of claim 17, further comprising, in the third mode:
   generating, in the control circuit:
      the first pull-down signal in the first pull-down state; and
      the second pull-down signal in the second pull-down state;
   in each stress enhanced inverter circuit in the stressed ring oscillator circuit:
      in response to the stressed enable signal in the second enable state, decoupling the inverter input from the first source/drain terminal of the first transistor;
      in response to the first pull-down signal in the first pull-down state, decoupling the first internal node from the ground voltage rail; and
      in response to the second pull-down signal in the second pull-down state, coupling the second internal node to the supply voltage rail.

21. An integrated circuit comprising:
   a circuit to be monitored comprising N-type field-effect transistors (FETs) (NFETs) and P-type FETs (PFETs); and
   a transistor aging monitor circuit comprising:
      a stressed ring oscillator circuit comprising a first plurality of stress-enhanced inverter circuits comprising at least one NFET and at least one PFET, the first plurality of stress-enhanced inverter circuits coupled in a first series of stress-enhanced inverter circuits, each of the first plurality of stress-enhanced inverter circuits comprising:
         a first transistor configured to couple an input node to a first internal node in response to a bias signal;
         a second transistor configured to couple a supply voltage rail to an inverter output in response to a voltage state of the first internal node; and a third transistor configured to couple a ground voltage rail to the inverter output in response to a voltage state of a second internal node;
wherein, in a first mode, one of the first plurality of stress-enhanced inverter circuits in the first series of stress-enhanced inverter circuits is configured to generate a first oscillator signal comprising a first frequency;
a reference ring oscillator circuit comprising a second plurality of stress-enhanced inverter circuits comprising at least one NFET and at least one PFET, the second plurality of stress-enhanced inverter circuits coupled in a second series of stress-enhanced inverter circuits, one of the second plurality of stress-enhanced inverter circuits configured to, in the first mode, generate a second oscillator signal comprising a second frequency; and
a comparator circuit configured to:
compare the first frequency to the second frequency; and
generate an indication of stress-based aging of transistors in a monitored circuit based on a difference between the first frequency and the second frequency.

* * * * *